United States Patent [19]

Sasaki et al.

[11] Patent Number: 4,778,872
[45] Date of Patent: Oct. 18, 1988

[54] POLYAMIC ACID SOLUTION COMPOSITION AND POLYIMIDE FILM MADE THEREFROM

[75] Inventors: Yoshikazu Sasaki; Hiroshi Inoue, both of Hirakata, Japan

[73] Assignee: Ube Industries, Ltd., Yamaguchi, Japan

[21] Appl. No.: 794,756

[22] Filed: Nov. 4, 1985

[30] Foreign Application Priority Data

Nov. 6, 1984 [JP] Japan ................. 59-232455

[51] Int. Cl.$^4$ ................. C08G 69/36; C08L 77/06
[52] U.S. Cl. ................. 528/176; 528/125; 528/183; 528/185; 528/187; 528/229; 528/329.1; 528/353; 525/436
[58] Field of Search ............... 528/176, 183, 187, 353, 528/125, 185, 229, 329.1; 525/436

[56] References Cited

U.S. PATENT DOCUMENTS 3,316,212  4/1967  Angelo et al. ................. 528/187
4,485,140  11/1984 Gannett et al. ................. 528/183
4,485,234  11/1984 Makino et al. ................. 528/353

Primary Examiner—John Kight
Assistant Examiner—M. L. Moore
Attorney, Agent, or Firm—Burgess, Ryan and Wayne

[57] ABSTRACT

Disclosed is an aromatic polyamic acid solution composition comprising an aromatic polyamic acid dissolved in an amount of 5 to 40% by weight in an organic polar solvent. The aromatic polyamic acid is prepared by polymerizing substantially equimolar amounts of an aromatic tetracarboxylic acid component comprising 15 to 85 mole % of a biphenyltetracarboxylic acid or its functional derivative and 15 to 85 mole % of a pyromellitic acid or its functional derivative and an aromatic diamine component comprising 30 to 100 mole % of a phenylenediamine and 0 to 70 mole % of a diaminodiphenyl ether. The aromatic polyamic acid solution composition is formed into an aromatic polyimide film having a relatively small thermal expansion coefficient, high mechanical strength and good flexibility.

27 Claims, No Drawings

POLYAMIC ACID SOLUTION COMPOSITION AND POLYIMIDE FILM MADE THEREFROM

BACKGROUND OF THE INVENTION (1) Field of the Invention

The present invention relates to an aromatic polyamic acid (i.e., polyamide acid) solution composition useful as a dope for the preparation of an aromatic polyimide film, which is used for the production of a polyimide composite sheet (inclusive of a tape) comprising an aromatic polyimide film or layer and a metal film or layer, that is advantageously used for a copper clad laminate for the production of a printed circuit board used in the electronic and electric industries or is used for other electronic material, for example, a magnetic tape, according to the kind of the metal material. Furthermore, the present invention relates to an aromatic polyimide film made from this solution composition.

(2) Description of the Related Art

Polyimide composite materials, such as composite sheets, comprising an aromatic polyimide film layer and a layer of a metal material are known. These known polyimide composite sheets comprising a polyimide film layer and a layer of a metal material, however, have some problems. For example, since the aromatic polyimide constituting the aromatic polyimide film layer has a considerably larger thermal expansion coefficient than that of the metal film layer, when a composite sheet is prepared by integrally laminating the polyimide film and the metal film under heating and when the formed composite sheet is exposed to a high temperature during processing or while it is used, the composite sheet curls. Moreover, since the aromatic polyimide film is not completely satisfactory in mechanical strength, heat resistance (the heat resistance at the soldering step) or flexibility, the obtained composite sheet cannot be advantageously used on an industrial scale as an electric or electronic material.

SUMMARY OF THE INVENTION

In view of the forgoing, it is a primary object of the present invention to provide an aromatic polyimide film capable of providing an excellent polyimide composite sheet having none of the defects of the known polyimide composite sheets.

Another object of the present invention is to provide a solution composition comprising an aromatic polyamic acid which is a precursor of the above-mentioned aromatic polyimide film.

In one aspect of the present invention, there is provided an aromatic polyamic acid solution composition comprising an aromatic polyamic acid dissolved in an amount of 5 to 40% by weight in an organic polar solvent. This aromatic polyamic acid is prepared by polymerizing substantially equimolar amounts of an aromatic tetracarboxylic acid component comprising, based on the total amount of the aromatic tetracarboxylic acid component, 15 to 85 mole % of a biphenyltetracarboxylic acid or a functional derivative thereof and 15 to 85 mole % of a pyromellitic acid or a functional derivative thereof, and an aromatic diamine component comprising, based on the total amount of the aromatic diamine component, 30 to 100 mole % of a phenylene diamine and 0 to 70 mole % of a diaminodiphenyl ether.

In another aspect of the present invention, there is provided an aromatic polyimide film formed by casting or coating the above-mentioned aromatic polyamic acid solution composition in the form of a film, and then maintaining the film at a high temperature to remove the organic polar solvent and imidize the polyamic acid.

In still another aspect of the present invention, there is provided a composite sheet comprising a polyimide layer and a metal layer. The polyimide layer has a second-order transition temperature of at least 300° C., a thermal expansion coefficient of $1.0 \times 10^{-5}$ to $3.0 \times 10^{-5}$ cm/cm/° C., a modulus of elasticity of 300 to 900 kg/mm$^2$ and an elongation of at least 20%.

The aromatic polyamic acid solution composition of the present invention can be easily formed into an aromatic polyimide film by the solution casting method or the like. Furthermore, the aromatic polyimide film obtained from this solution composition has a relatively small thermal expansion coefficient which is close to the thermal expansion coefficient of an ordinary metal film, and the aromatic polyimide film has not only high mechanical strength but also good flexibility. Accordingly, a composite sheet comprising an aromatic polyimide film layer formed from the solution composition of the present invention and a metal film layer does not curl, even though the composite sheet undergoes a high heat history during preparation.

Since the aromatic polyimide film (inclusive of a film, a sheet, a covering or the like) has a relatively high second order transition temperature, even if the composite sheet is exposed to a high temperature (up to about 300° C.) at the soldering step or the other processing steps, no particular problem occurs, and the composite sheet exhibits an excellent heat resistance.

DESCRIPTION OF THE PREFERRED EMBODIMENTS

The aromatic polyamic acid used in the present invention is a high-molecular-weight aromatic polyamic acid obtained by polymerizing substantially equimolar amounts of an aromatic tetracarboxylic acid component comprising, based on the total amount of the aromatic tetracarboxylic acid component, 15 to 85 mole %, preferably 20 to 85 mole %, of a biphenyltetracarboxylic acid or a functional derivative thereof and 15 to 85 mole %, preferably 15 to 80 mole %, of a pyromellitic acid or a functional derivative thereof and an aromatic diamine component comprising, based on the total amount of the aromatic diamine component, 30 to 100 mole %, preferably 0 to 95 mole %, of a phenylene diamine, and 0 to 70 mole %, preferably 5 to 60 mole %, of a diaminodiphenyl ether.

If the ratio of the biphenyltetracarboxylic acid in the aromatic tetracarboxylic acid component is too low, an aromatic polyimide film formed from the obtained aromatic polyamic acid has an increased thermal expansion coefficient or a reduced tensile elongation at break, and the final composite sheet has a poor flexibility. If the ratio of the biphenyltetracarboxylic acid in the aromatic tetracarboxylic acid is too high, the formed aromatic polyimide film has a low second-order transition temperature. It is sufficient if the sum of the amounts of the biphenyltetracarboxylic acid and the pyromellitic acid is about 100 mole % in the aromatic tetracarboxylic acid component. However, part of each of the foregoing tetracarboxylic acids may be substituted by other aromatic tetracarboxylic acid in an amount of up to about 5 mole % based on the total amount of the tetracarboxylic acid component. In view of the properties of the obtained aromatic polyimide film, it is more preferable that an aromatic tetracarboxylic acid component comprising 25 to 85 mole % of a biphenyltetracarboxylic acid and 15 to 75 mole % of a pyromellitic acid be used as the aromatic tetracarboxylic acid component.

In the aromatic diamine component, if the ratio of the phenylene diamine is too low and ratio of the diaminodiphenyl ether is too high, an aromatic polyimide film formed from the obtained aromatic polyamic acid has a high thermal expansion coefficient or a low modulus of elasticity or second-order transition temperature, and thus has poor stiffness and heat resistance. If the ratio of the phenylene diamine is close to 100 mole %, the elongation and other physical properties of the aromatic polyimide film are sometimes degraded, and the polyimide film is broken under an abrupt tension or impact or the stiffness becomes too high and the flexibility is reduced. It is sufficient if the sum of the amounts of the phenylene diamine and the diaminodiphenyl ether is about 100 mole % in the aromatic diamine component. However, a part of each of the foregoing diamines may be substituted by other aromatic diamine in an amount of up to about 5 mole % based on the total diamine component. In view of the properties of the obtained aromatic polyimide film, it is most preferred that an aromatic diamine component comprising 55 to 90 mole % of a phenylene diamine and 10 to 45 mole % of a diaminodiphenyl ether be used as the aromatic diamine component.

As preferred examples of the biphenyltetracarboxylic acid and its functional derivative used in the present invention, there can be mentioned 2,3,3',4'-biphenyltetracarboxylic acid and its dianhydride, 3,3'4,4'-biphenyltetracarboxylic acid and its dianhydride, and lower alcohol esters of these acids. As preferred examples of the pyromellitic acid and its functional derivatives, there can be mentioned pyromellitic acid and its dianhydride, and lower alcohol esters thereof.

As preferred examples of the other tetracarboxylic acid that can be used as part of the foregoing aromatic tetracarboxylic acid component, there can be mentioned 3,3',4,4'-benzophenone-tetracarboxylic acid and its dianhydride, bis(3,4-dicarboxyphenyl)methane dianhydride, and bis(3,4-dicarboxyphenyl)ether dianhydride.

As the phenylene diamine to be used in the present invention, there can be mentioned 1,4-diaminobenzene (p-phenylenediamine), 1,3-diaminobenzene, and 1,2-diaminobenzene. As the diaminodiphenyl ether, there can be mentioned 4,4'-diaminodiphenyl ether, 3,3'-diaminodiphenyl ether, and 3,4'-diaminodiphenyl ether.

As the other diamine that can be used as part of the foregoing aromatic diamine component, there can be mentioned 4,4'-diaminodiphenylmethane, 3,3'-diaminodiphenylmethane, 3,4'-diaminodiphenylmethane, 4,4'-diaminobenzophenone, 4,4'-diaminodiphenylsulfone, o-toluidine, and 3,5-diaminobenzoic acid.

This aromatic polyamic acid is a polymer having a high molecular weight as corresponding to a logarithmic viscosity number of about 0.1 to about 5, especially about 0.2 to about 3, as determined at 30° C. with respect to an N-methyl-2-pyrrolidone solution having a polymer concentration of 0.5 g/100 ml. The polymer has amide-acid linkages as the linkages of the main chain and is soluble in anorganic polar solvent. When this polyamic acid is imidized by heating or other means, a heat-resistant aromatic polyimide consisting essentially of imide linkages is obtained.

The aromatic polyamic acid used in the present invention is prepared by polymerizing substantially equimolar amounts of the above-mentioned aromatic tetracarboxylic acid component and aromatic diamine component at a polymerization temperature preferably not higher than 100° C., more preferably not higher than 80° C., for about 0.2 to about 60 hours in an organic polar solvent so that a desired high molecular weight is attained.

In the above-mentioned polymerization process, polymerization is ordinarily conducted batchwise or in a continuous manner while equimolar amounts of the tetracarboxylic acid component and the diamine component are simultaneously supplied. However, there may be adopted a method in which the respective monomer components are not used simultaneously in equimolar amounts but are added at different ratios at different times so that the amounts of both components finally become equimolar.

In the above-mentioned preparation process, it is not indispensable that the tetracarboxylic acid component and diamine component be used in absolutely equimolar amounts. In order to adjust the molecular weight, one of the two components may be used in a molar excess of up to 3 mole %, especially up to 1 mole %.

An organic polar solvent having a boiling point not higher than 300° C., especially not higher than 250° C., under atmospheric pressure is preferably used as the organic polar solvent in the above-mentioned polymerization process. Such organic polar solvents include, for example, N-methyl-2-pyrrolidone, dimethylsulfoxide, N,N-dimethylacetamide, N,N-dimethylformamide, N,N-diethylacetamide, N,N-diethylformamide, and dimethylsulfone. These organic polar solvents may be used in the form of mixtures with other organic solvents such as benzene, toluene, benzonitrile, xylene, solvent naphtha, and dioxane.

The aromatic polyamic acid solution composition of the present invention is a solution composition in which the specific aromatic polyamic acid prepared in the above-mentioned manner is dissolved in an organic polar solvent at a concentration of 5 to 40% by weight, preferably 5 to 35% by weight, more preferably 7 to 30% by weight.

The solution composition of the present invention may be prepared by isolating the aromatic polyamic acid prepared in the above-mentioned manner from the polymerization reaction liquid and dissolving the isolated polymer in an organic polar solvent. Alternatively, a method may be adopted in which the same solvent as used for the solution composition is used as the polymerization solvent in the above-mentioned process for the preparation of the aromatic polyamic acid, namely, the respective monomers are polymerized in this organic polar solvent and thus the solution composition of the present invention is formed directly without isolation of the aromatic polyamic acid.

In view of the ease in handling of the solution composition, it is preferred that the rotation viscosity i.e., a solution viscosity as determined at 30° C. by using a rotational viscometer be about 0.1 to about 50,000 poise, especially about 0.5 to about 30,000 poise, more especially about 1 to about 20,000 poise.

The aromatic polyimide film is prepared, for example, according to a process in which the above-mentioned aromatic polyamic acid solution composition is cast or coated on the surface of an appropriate support (such as a metal, ceramic or plastic roll, a metal belt, or a roll or belt to which a metal film tape is being supplied) at normal temperature or under heating to continuously form a film of the solution composition having a uniform thickness of about 10 to about 2000 μm, especially about 30 to about 1000 μm, and the film on the support is gradually heated at temperatures ranging from about 50° to about 500° C. under atmospheric or reduced pressure to dry the film and solidify the film by evaporating the solvent from the film, and the polyamic acid (solidified film) is imidized (cyclized to imide ring) under heating at a high temperature so that the imidation degree is at least 90%, preferably at least 95%, whereby an aromatic polyimide film having a thickness of about 0.5 to about 300 μm, preferably 1 to 200 μm is obtained.

The average thermal expansion coefficient of the aromatic polyimide film of the present invention at temperatures ranging from 100° to 300° C. is relatively small and is close to those of ordinary metals such as copper and its alloys, and iron, nickel, cobalt, chromium, and alloys thereof (for example, steel, nickel steel, chromium steel, and magnetic materials). Accordingly, a composite sheet comprising a film layer of such a metal and a layer of the aromatic polyimide film of the present invention does not curl when heated at the preparation step or other steps, and therefore, this composite sheet can be advantageously used as a flexible printed circuit board (copper clad laminates).

The aromatic polyimide film of the present invention has excellent mechanical properties such as a tensile strength of at least about 20 kg/mm$^2$, especially at least 25 kg/mm$^2$, an elongation of at least about 20%, and a modulus of elasticity of about 300 to about 900 kg/mm$^2$, and has excellent thermal properties such as a high second-order transition temperature of at least about 300° C. and a high thermal decomposition initiation temperature of at least about 400° C. Accordingly, the aromatic polyimide film of the present invention can be practically and satisfactorily applied to the above-mentioned uses.

If the above-mentioned monomer components are used at appropriately selected ratios in preparing the above-mentioned aromatic polyamic acid, there can be obtained an aromatic polyimide film having (a) a thermal expansion coefficient of $1.0 \times 10^{-5}$ to $3.0 \times 10^{-5}$ cm/cm/° C., especially about $1.2 \times 10^{-5}$ to about $2.8 \times 10^{-5}$ cm/cm/° C., (b) a second-order transition temperature higher than 300° C., preferably 305° C. to 600° C., more preferably 310° C. to 550° C., (c) a modulus of elasticity of 300 to 900 kg/mm$^2$, especially about 350 to about 700 kg/mm$^2$, and (d) an elongation of at least 20%, especially about 40 to about 120%. The aromatic polyimide having these properties has a satisfactory mechanical strength and thermal characteristics as required in the abovementioned uses.

As pointed out hereinbefore, the aromatic polyimide film of the present invention is well-balanced in various mechanical and thermal properties, and especially, it has a thermal expansion coefficient close to that of an ordinary metal film, a relatively high second-order transition temperature, and an excellent electrically insulating property. Accordingly, the aromatic polyimide film of the present invention is useful as a protecting covering film or supporting film for a metal film layer of an electric or electronic material. More specifically, the aromatic polyimide film of the present invention is advantageously used as a supporting film layer of a flexible printed circuit board or a magnetic tape.

The present invention will now be described in detail with reference to the following examples and comparative examples.

EXAMPLE 1

A cylindrical polymerization vessel having an inner volume of 300 ml was charged with 20.5 g (0.07 mole) of 3,3′,4,4′-biphenyltetracarboxylic dianhydride, 6.54 g (0.03 mole) of pyromellitic dianhydride, 5.41 g (0.05 mole) of p-phenylenediamine, 10.01 g (0.05 mole) of 4,4′-diaminodiphenyl ether, and 198.0 g of N-methyl-2-pyrrolidone. This liquid mixture was subjected to polymerization at a temperature of 50° C. with stirring under atmospheric pressure for 44 hours to obtain a reaction liquid containing about 20.0% by weight of an aromatic polyamic acid having a logarithmic viscosity number of 2.04 (as measured at 30° C. with respect to an N-methyl-2-pyrrolidone solution having a polymer concentration of 0.5 g/100 ml), a rotation viscosity of about 1300 poise (as measured at 30° C.), and an imidation degree lower than 10%. This reaction liquid has a good storage stability and no change was caused when the reaction solution was allowed to stand for about one month.

The thus-obtained aromatic polyamic acid solution composition was cast on a copper foil having a thickness of about 30 μm (thermal expansion coefficient of $1.66 \times 10^{-5}$ cm/cm/° C.) to form a film of the solution composition having a uniform thickness of about 150 μm. The solution film was dried and solidified by elevating the temperature within a range of from about 60° to about 200° C. and was then heat-treated by elevating the temperature to 350° C. to form a copper clad laminate comprising an aromatic polyimide film layer having a thickness of 30 μm and a copper film layer having a thickness of 30 μm. A curl having a radius of curvature smaller than 50 cm was not present in this copper clad laminate, and the copper clad laminate had an appropriate flexibility and could be advantageously used as a flexible printed circuit board.

The copper film layer was dissolved away from the thus-prepared copper clad laminate by an etching solution to obtain an aromatic polyimide film. The physical properties of this aromatic polyimide film were determined. It was found at the tensile test that the tensile strength was 36.1 kg/mm$^2$, the elongation was 60%, and the modulus of elasticity was 507 kg/mm$^2$. When the thermal expansion coefficient was determined at temperatures ranging from 100° to 300° C., it was found that the linear thermal expansion coefficient was $1.9 \times 10^{-5}$ cm/cm/°C. At the TMA tensile method (sample width=5 mm, load=2 g, temperature-elevating rate =10° C./min), it was found that the second-order transition temperature (Tg) was 360° C., and the thermal decomposition initiating temperature was about 440° C.

EXAMPLES 2 THROUGH 18

Aromatic polyamic acid solution compositions were prepared in the same manner as described in Example 1, except that the ratios of the monomers used for the preparation of the aromatic polyamic acid were changed as shown in Table 1. Copper clad laminates were prepared in the same manner as described in Example 1, except that these solution compositions were used.

Aromatic polyimide films were prepared in the same manner as described in Example 1, except that these copper clad laminates were used. The physical properties of the films were measured and the obtained results are shown in Table 1.

COMPARATIVE EXAMPLES 1 THROUGH 6

Aromatic polyamic acid solution compositions were prepared in the same manner as described in Example 1 except that the ratios of the monomers used for the preparation of the aromatic polyamic acid were changed as shown in Table 2. Copper clad laminates were prepared in the same manner as described in Example 1, except that these solution compositions were used.

Aromatic polyimide films were prepared in the same manner as described in Example 1, except that these copper clad laminates were used. The physical properties of the films were measured and the obtained results are shown in Table 2.

TABLE 1

| Example No. | Monomers (millimoles) | | | | Tensile test results | | | Thermal expansion coefficient (cm/cm/°C.) ($\times 10^{-5}$) | Second-order transition temperature (°C.) |
|---|---|---|---|---|---|---|---|---|---|
| | PPD | DADE | BPDA | PMDA | Tensile strength (kg/mm$^2$) | Elongation (%) | Modulus of elasticity (kg/mm$^2$) | | |
| 2 | 100 | 0 | 60 | 40 | 43.2 | 46 | 697 | 1.3 | 384 |
| 3 | 90 | 10 | 80 | 20 | 36.4 | 40 | 668 | 2.2 | 310 |
| 4 | 80 | 20 | 80 | 20 | 40.6 | 60 | 565 | 2.8 | 308 |
| 5 | 80 | 20 | 70 | 30 | 34.2 | 48 | 591 | 2.2 | 322 |
| 6 | 80 | 20 | 60 | 40 | 33.1 | 46 | 559 | 2.2 | 348 |
| 7 | 80 | 20 | 50 | 50 | 30.7 | 40 | 581 | 2.6 | 350 |
| 8 | 70 | 30 | 70 | 30 | 33.8 | 62 | 496 | 2.9 | 315 |
| 9 | 70 | 30 | 60 | 40 | 29.1 | 52 | 474 | 2.6 | 340 |
| 1 | 70 | 30 | 50 | 50 | 36.1 | 60 | 507 | 1.9 | 360 |
| 10 | 70 | 30 | 40 | 60 | 26.1 | 44 | 475 | 1.9 | 407 |
| 11 | 70 | 30 | 30 | 70 | 26.4 | 58 | 469 | 2.5 | 400 |
| 12 | 60 | 40 | 70 | 30 | 31.4 | 52 | 487 | 2.9 | 320 |
| 13 | 60 | 40 | 50 | 50 | 29.4 | 60 | 444 | 2.8 | 347 |
| 14 | 60 | 40 | 40 | 60 | 23.3 | 44 | 465 | 2.1 | 350 |
| 15 | 50 | 50 | 40 | 60 | 23.1 | 56 | 392 | 2.6 | 357 |
| 16 | 50 | 50 | 30 | 70 | 23.9 | 42 | 371 | 2.1 | 310 |

TABLE

| Comparative Example No. | Monomers (millimoles) | | | | Tensile test results | | | Thermal expansion coefficient (cm/cm/°C.) ($\times 10^{-5}$) | Second-order transition temperature (°C.) |
|---|---|---|---|---|---|---|---|---|---|
| | PPD | DADE | BPDA | PMDA | Tensile strength (kg/mm$^2$) | Elongation (%) | Modulus of elasticity (kg/mm$^2$) | | |
| 1 | 50 | 50 | 100 | 0 | 39.0 | 64 | 460 | 3.6 | 290 |
| 2 | 50 | 50 | 90 | 10 | 35.7 | 46 | 430 | 3.7 | 290 |
| 3 | 25 | 75 | 20 | 80 | 20.3 | 65 | 325 | 4.6 | 360 |
| 4 | 25 | 75 | 10 | 90 | 21.8 | 61 | 320 | 4.0 | 390 |
| 5 | 0 | 100 | 100 | 0 | 25.0 | 100 | 390 | 4.0 | 285 |
| 6 | 0 | 100 | 0 | 100 | 24.2 | 86 | 279 | 3.1 | 373 |

Note:
PPD = p-phenylene diamine
DADE = 4,4'-diaminodiphenyl ether
BPDA = 3,3',4,4'-biphenyltetracarboxylic dianhydride
PMDA = pyromellitic dianhydride In each of the copper clad laminates obtained in the example of the present invention, since the difference of the thermal expansion coefficient between the aromatic polyimide film layer and the copper film layer was considerably small, a curl having a radius of curvature smaller than 50 cm was not formed, and each substrate was a substantially flat composite sheet. In contrast, in each of the copper clad laminates obtained in the comparative examples, since the differece of the thermal expansion coefficient between the aromatic polyimide film layer and the copper film layer was considerably large, curls having a radius of curvature smaller than 10 cm were present.

We claim:
1. An aromatic polyamic acid solution composition comprising an aromatic polyamic acid, which when imidized forms an aromatic polyamide having essentially imide linkages as the linkage of main chain, dissolved in an amount of 5 to 40% by weight in an organic polar solvent, said aromatic polyamic acid being prepared by polymerizing substantially equimolar amounts of:
(a) an aromatic tetracarboxylic acid component consisting essentially of, based on the total amount of the aromatic tetracarboxylic acid component, 15 to 85 mole % of a biphenyltetracarboxylic acid or a functional derivative thereof and 15 to 85 mole % of a pyromellitic acid or a functional derivative thereof, and
(b) an aromatic diamine component consisting essentially of, based on the total amount of the aromatic diamine component, 30 to 100 mole % of a phenylenediamine and 0 to 70 mole % of a diaminodiphenyl ether.

2. An aromatic polyamic acid solution composition according to claim 1 wherein the aromatic tetracarboxylic acid component comprises, based on the total amount of the aromatic tetracarboxylic acid component, 20 to 85 mole % of a biphenyltetracarboxylic acid or a functional derivtive thereof and 15 to 80 mole % of a pyromellitic acid or a functional derivative thereof.

3. An aromatic polyamic acid solution composition according to claim 1 wherein the aromatic tetracarboxylic acid component comprises, based on the total amount of the aromatic tetracarboxylic acid component, 25 to 85 mole % of a biphenyltetracarboxylic acid or a functional derivative thereof and 15 to 75 mole % of a pyromellitic acid or a functional derivative thereof.

4. An aromatic polyamic acid solution composition according to claim 1 wherein the aromatic diamine component comprises, based on the total amount of the aromatic diamine component, 40 to 95 mole % of a phenylenediamine and 5 to 60 mole % of a diaminodiphenyl ether.

5. An aromatic polyamic acid solution composition according to claim 1 wherein the aromatic diamine component comprises, based on the total amount of the aromatic diamine component, 55 to 90 mole % of a phenylenediamine and 10 to 45 mole % of a diaminodiphenyl ether.

6. An aromatic polyamic acid solution composition according to claim 1 wherein the biphenyltetracarboxylic acid or functional derivative thereof is selected from the group consisting of 2,3,3',4'-biphenyltetracarboxylic acid and its dianhydride, 3,3',4,4'-biphenyltetracarboxylic acid and its dianhydride, and lower alcohol esters thereof.

7. An aromatic polyamic acid solution composition according to claim 1 wherein the pyromellitic acid or functional derivative thereof is selected from the group consisting of pyromellitic acid, its dianhydride and its lower alcohol ester.

8. An aromatic polyamic acid solution composition according to claim 1 wherein the phenylenediamine is selected from the group consisting of 1,4-diaminobenzene-(p-phenylenediamine), 1,3-diaminobenzene and 1,2-diaminobenzene.

9. An aromatic polyamic acid solution composition according to claim 1 wherein the diaminodiphenyl ether is selected from the group consisting of 4,4'-diaminodiphenyl ether, 3,3'-diaminodiphenyl ether and 3,4'-diaminodiphenyl ether.

10. An aromatic polyamic acid solution composition according to claim 1 wherein the aromatic polyamic acid has a logarithmic viscosity number of about 0.1 to about 5 as determined at 30° C. with respect to an N-methyl-2-pyrrolidone solution having a polymer concentration of 0.5 g/100 ml.

11. An aromatic polyamic acid solution composition according to claim 1 wherein the polymerization of the aromatic tetracarboxylic acid component and the aromatic diamine component is carried out at a temperature not higher than 100° C. in an organic polar solvent.

12. An aromatic polyamic acid solution composition according to claim 1 wherein the organic polar solvent is selected from the group consisting of N-methyl-2-pyrrolidone, dimethylsulfoxide, N,N-dimethylacetamide, N,N-dimethylformamide, N,N-diethylacetamide, N,N-diethylformamide, dimethylsulfone and mixtures thereof.

13. An aromatic polyamic acid solution compositoin according to claim 1 wherein the aromatic polyamic acid is dissolved in an amount of 5 to 35% by weight in the organic polar solvent.

14. An aromatic oolyamic acid solution composition according to claim 1 which has a rotation viscosity of about 0.1 to about 50000 poise as determined at 30° C.

15. An aromatic polyimide film. formed by casting or coating in the form of a film an aromatic polyamic acid solution composition comprising an aromatic polyamic acid dissolved in an amount of 5 to 40% by weight in an organic polar solvent, said aromatic polyamic acid being prepared by polymerizing substantially equimolar amounts of an aromatic tetracarboxylic acid component comprising, based on the total amount of the aromatic tetracarboxylic acid component, 15 to 85 mole % of a biphenyltetracarboxylic acid or a functional derivative thereof and 15 to 85 mole % of a pyromellitic acid or a functional derivative thereof and an aromatic diamine component comprising, based on the total amount of the aromatic diamine component, 30 to 100 mole % of a phenylenediamine and 0 to 70 mole % of a diaminodiphenyl ether, and then maintaining the film at a high temperature to remove the organic polar solvent and imidize the polyamic acid.

16. An aromatic polyimide film according to claim 15 wherein the biphenyltetracarboxylic acid or functional derivative thereof is selected from the group consisting of 2,3,3',4'-biphenyltetracarboxylic acid and its dianhydride, 3,3',4,4'-biphenyltetracarboxylic acid and its dianhydride, and lower alcohol esters thereof.

17. An aromatic polyimide film according to claim 15 wherein the pyromellitic acid or functional derivative thereof is selected from the group consisting of pyromellitic acid, its dianhydride and its lower alcohol ester.

18. An aromatic polyimide film according to claim 15 wherein the phenylenediamine is selected from the group consisting of 1,4-diaminobenzene-(p-phenylenediamine), 1,3-diaminobenzene and 1,2-diaminobenzene.

19. An aromatic polyimide film according to claim 15 wherein the diaminodiphenyl ether is selected from the group consisting of 4,4'-diaminodiphenyl ether, 3,3'-diaminodiphenyl ether and 3,4'-diminodiphenyl ether.

20. An aromatic polyimide film according to claim 15 wherein the aromatic polyamic acid has a logarithmic viscosity number of about 1 to about 5 as determined at 30° C. with respect to an N-methyl-2-pyrrolidone solution having a polymer concentration of 0.5 g/100 ml.

21. An aromatic polyimide film according to claim 15 wherein the organic solvent is selected from the group consisting of N-methyl-2-pyrrolidone, dimethylsulfoxide, N,N-dimethylacetamide, N,N-dimethylformamide, N,N-diethylacetamide, N,N-diethylformamide, dimethylsulfone and mixtures thereof.

22. An aromatic polyimide film according to claim 15 wherein the cast or coated film having a thickness of about 10 to about 2000 μm is heated gradually at temperatures ranging from about 50° to about 500° C. to solidify the film by evaporating the solvent from the film and then heated to a temperature sufficiently high to imidize the polyamic acid into a polyimide at an imidation degree of at least 90%.

23. An aromatic polyimide film according to claim 15 which has a second-order transition temperature of at least 300° C., a thermal expansion coefficient of $1.0 \times 10^{-5}$ to $3.0 \times 10^{-5}$ cm/cm/° C., a modulus of elasticity of 300 to 900 kg/mm$^2$ and an elongation of at least 20%.

24. An aromatic polyimide film according to claim 15 which has a second-order transition temperature of 305° to 600° C., a thermal expansion coefficient of $1.2 \times 10^{-5}$ to $2.8 \times 10^{-5}$ cm/cm/° C., a modulus of elasticity of 350 to 700 kg/mm$^2$ and an elongation of 40 to 120%.

25. A composite sheet comprising a polyimide layer and a metal layer, said polyimide layer having a second-order transition temperature of at least 300° C., a thermal expansion coefficient of $1.0 \times 10^{-5}$ to $3.0 \times 10^{-5}$ cm/cm/° C., a modulus of elasticity of 300 to 900 kg/mm² and an elongation of at least 20%.

26. A composite sheet according to claim 25 wherein said polyimide layer is formed from an aromatic polyamic acid prepared by polymerizing substantially equimolar amounts of an aromatic tetracarboxylic acid component comprising, based on the total amount of the aromatic tetracarboxylic acid component, 15 to 85 mole % of a biphenyltetracarboxylic acid or a functional derivative thereof and 15 to 85 mole % of a pyromellitic acid or a functional derivative thereof, and an aromatic diamine component comprising, based on the total amount of the aromatic diamine component, 30 to 100 mole % of a phenylenediamine and 0 to 70 mole % of a diaminodiphenyl ether.

27. A composite sheet according to claim 25 wherein said polyimide layer has a second-order transition temperature of 305° to 600° C., a thermal expansion coefficient of $1.2 \times 10^{-5}$ to $2.8 \times 10^{-5}$ cm/cm/° C., a modulus of elasticity of 350 to 700 kg/mm² and an elongation of 40 to 120%.

* * * * *

UNITED STATES PATENT AND TRADEMARK OFFICE
CERTIFICATE OF CORRECTION

PATENT NO. : 4,778,872
DATED : October 18, 1988
INVENTOR(S) : Yoshikazu Sasaki, et al.

It is certified that error appears in the above-indentified patent and that said Letters Patent is hereby corrected as shown below:

On the title page, item [54] and in column 1, line 3, "POLYMIDE" should read --POLYIMIDE--.
Column 8, line 4; "polyamide" should read -- polyimide --.

Signed and Sealed this

Seventeenth Day of October, 1995

Attest:

BRUCE LEHMAN

*Attesting Officer*     Commissioner of Patents and Trademarks